(12) United States Patent
Park

(10) Patent No.: US 7,416,946 B2
(45) Date of Patent: Aug. 26, 2008

(54) SEMICONDUCTOR DEVICE AND METHOD OF MANUFACTURING THE SEMICONDUCTOR DEVICE

(75) Inventor: Joon-Jin Park, Gunpo (KR)

(73) Assignee: Dongbu Electronics Co., Ltd., Seoul (KR)

( * ) Notice: Subject to any disclaimer, the term of this patent is extended or adjusted under 35 U.S.C. 154(b) by 424 days.

(21) Appl. No.: 11/315,369

(22) Filed: Dec. 23, 2005

(65) Prior Publication Data

US 2006/0141689 A1      Jun. 29, 2006

(30) Foreign Application Priority Data

Dec. 23, 2004    (KR)    ............... 10-2004-0111564

(51) Int. Cl.
H01L 21/336    (2006.01)
(52) U.S. Cl. ............... 438/270; 438/300; 257/E21.41
(58) Field of Classification Search ............... 438/269, 438/270, 300, 976; 257/E21.41
See application file for complete search history.

(56) References Cited

U.S. PATENT DOCUMENTS 5,705,409 A * 1/1998 Witek ............... 438/270
6,387,758 B1 * 5/2002 Yu et al. ............... 438/300
6,664,143 B2 * 12/2003 Zhang ............... 438/268

* cited by examiner

Primary Examiner—Chandra Chaudhari
(74) Attorney, Agent, or Firm—Lowe Hauptman Ham & Berner LLP

(57) ABSTRACT

A method of manufacturing a semiconductor. A first epitaxial layer is formed on a gate nitride layer, and a protection nitride layer is formed on the first epitaxial and gate nitride layers. A first gate insulation layer is formed on a drain silicide, a gate oxide layer is formed on a portion of the first epitaxial layer exposed by a trench. A second epitaxial layer is formed on the first layer. Polysilicon fills the trench to form a gate electrode. Ion-implanting impurities on the second epitaxial layer forms a source region. A second gate insulation layer is formed on the gate electrode and the gate oxide layer, a source silicide is formed on the second gate insulation layer, and an interlayer insulation layer is formed on the second epitaxial layer, source region and source silicide. Source, gate and drain contact holes expose the source silicide, gate electrode and drain silicide.

8 Claims, 3 Drawing Sheets

SEMICONDUCTOR DEVICE AND METHOD OF MANUFACTURING THE SEMICONDUCTOR DEVICE

BACKGROUND OF THE INVENTION (a) Field of the Invention

The present invention relates to a semiconductor device and a method of manufacturing the semiconductor device, and more particularly to a method of manufacturing a transistor of the semiconductor device.

(b) Discussion of the Related Art

Generally, a semiconductor device includes a plurality of transistors. The transistors include device regions, each having a source/drain region and a gate electrode. The device regions are separated from one another by a device isolation method such as a LOCOS (local oxidation of silicon) or STI (shallow trench isolation) method.

A method of manufacturing a conventional semiconductor device transistor is described below.

A gate insulation layer and a polysilicon layer are sequentially formed on a semiconductor substrate to form the transistor of the semiconductor device. A gate electrode is formed by etching the polysilicon layer and the gate insulation layer using a mask formed on the polysilicon layer.

Low-concentration impurities are ion-implanted into a semiconductor substrate using the gate electrode as a mask. A sidewall is formed by performing a photolithography and etching process for an oxide layer and nitride layer which are sequentially formed on the gate electrode and the semiconductor substrate. Here, a high concentration junction region is formed by ion-implanting high-concentration impurities into the semiconductor substrate using the sidewall and the gate electrode as a mask. The high concentration junction region includes a source/drain junction region.

After depositing a metal layer on the semiconductor substrate including the gate electrode and the source/drain region, a metal silicide is formed by performing a heat treatment at a predetermined temperature on the metal layer.

A salicide forming process is used for forming the silicide. According to the salicide forming process, the silicide is formed only on the source/drain region including silicon and the gate electrode including polysilicon, by selectively etching the metal layer on the oxide layer other than at the gate and source/drain region. The metal layer to be etched is a layer that does not react with silicon. Such a silicide is used to decrease resistance, because low resistance increases the speed at which the semiconductor device can operate.

However, even when the size of the transistor is decreased due to higher integration in the semiconductor device, the transistor still occupies a larger than desired volume due to its horizontal structure, which includes the source/drain region at both sides of the gate electrode.

SUMMARY OF THE INVENTION

To address the above-described and other problems, it is an object of the present invention is to provide a method of manufacturing a semiconductor device. The method includes forming a drain silicide on a semiconductor substrate, forming a drain region at both sides of the drain silicide, and forming a gate nitride layer on the drain silicide. A first epitaxial layer is formed on lateral sides of the gate nitride layer, and a protection nitride layer is formed on the first epitaxial layer and the gate nitride layer. The protection nitride layer and the gate nitride layer are etched to form a trench. A first gate insulation layer is formed on the drain silicide, a gate oxide layer is formed on a portion of the first epitaxial layer exposed by the trench, and a second epitaxial layer is formed on the first epitaxial layer after removal of the protection nitride layer. The trench is filled with polysilicon to form a gate electrode. Ion-implanting impurities on the second epitaxial layer forms a source region. A second gate insulation layer is formed on the gate electrode and the gate oxide layer, a source silicide is formed on the second gate insulation layer, and an interlayer insulation layer is formed on the second epitaxial layer, the source region and the source silicide. Source, gate and drain contact holes expose the source silicide, gate electrode and drain silicide.

The present invention further provides a semiconductor device. A semiconductor substrate includes a drain silicide and drain region. A first epitaxial layer is disposed on the semiconductor substrate and the drain region, the first epitaxial layer defining a trench. A first gate insulation layer is disposed on the drain silicide. A gate oxide layer is disposed on lateral sides of the trench. A gate electrode is disposed in the trench. A second epitaxial layer is disposed on the first epitaxial layer, the second epitaxial layer including a source region. A second gate insulation layer is disposed on the gate electrode and the gate oxide layer. A source silicide is disposed on the second gate insulation layer. An interlayer insulation layer is disposed on the second epitaxial layer and the source silicide. Source, gate and drain contact holes expose portions of the source silicide, the gate electrode and the drain silicide.

BRIEF DESCRIPTION OF THE DRAWINGS

The accompanying drawings, which are incorporated in and constitute a part of the specification, illustrate an embodiment of the invention, and together with the description serve to explain principles of the invention.

DETAILED DESCRIPTION OF THE INVENTION

An exemplary embodiment of the present invention is described below with reference to the accompanying drawings.

FIGS. 1-9 are cross-sectional views showing sequential stages of a method of manufacturing a transistor of a semiconductor device according to the present invention.

Figure 1:
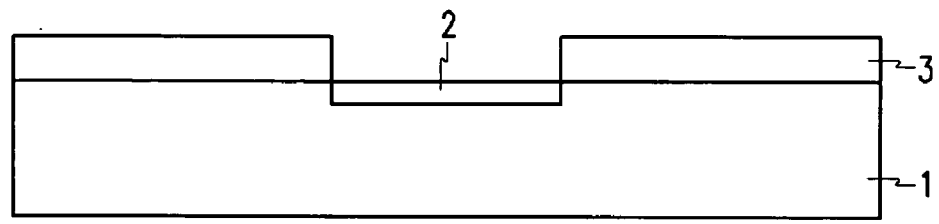
FIGS. 1-9 are cross-sectional views showing sequential stages of a method of manufacturing a transistor of a semiconductor device according to the present invention.

As shown in FIG. 1, a drain silicide 2 is formed after forming a photosensitive layer 3 on a semiconductor substrate 1.

Figure 2:
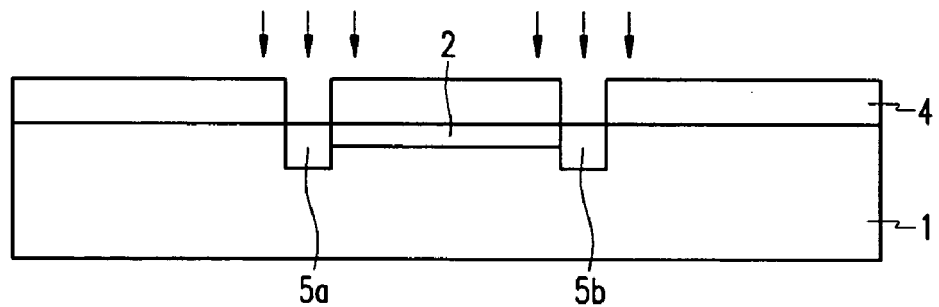

FIG. 2 shows a photosensitive layer 4 that is formed on the semiconductor substrate 1 and drain silicide 2 after removing the photosensitive layer 3. Drain regions 5a and 5b are formed by ion-implanting high-concentration impurities using the photosensitive layer 4 as a mask. The drain regions 5a and 5b can be formed after the photosensitive layer 4 is formed.

Figure 3:
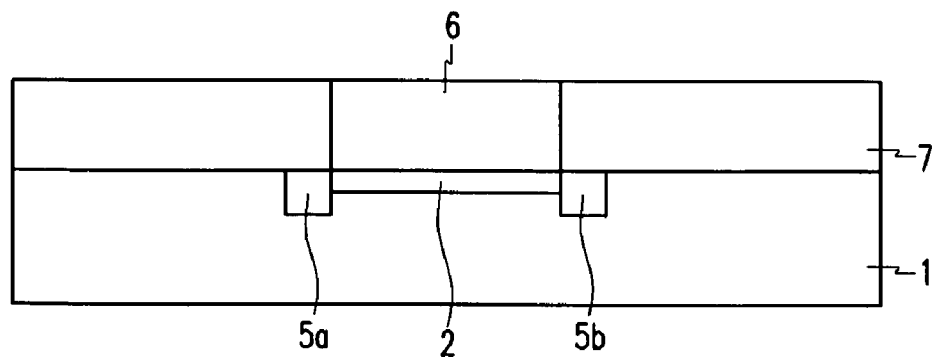

As shown in FIG. 3, a gate nitride layer 6 is formed on the drain silicide 2 after removing the photosensitive layer 4. A first epitaxial layer 7 is formed on the semiconductor substrate 1 and drain regions 5a and 5b. The first epitaxial layer 7 can be formed after the gate nitride layer 6 is formed.

Figure 4:
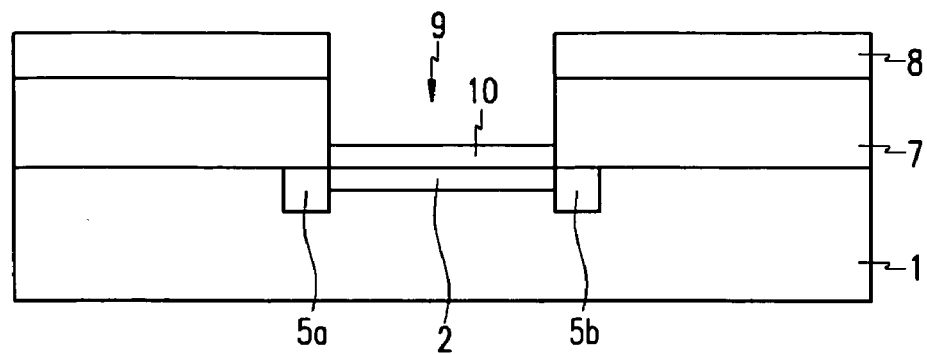

A protection nitride layer 8 formed on the first epitaxial layer 7 and gate nitride layer 6. A photosensitive layer is formed on the protection nitride layer 8, and then a trench 9 is formed by etching the protection nitride layer 8 and the gate nitride layer 6 using the photosensitive layer as a mask. The etching exposes the drain silicide 2. As shown in FIG. 4, a first gate insulation layer 10 is formed on the exposed drain silicide 2.

Figure 5:
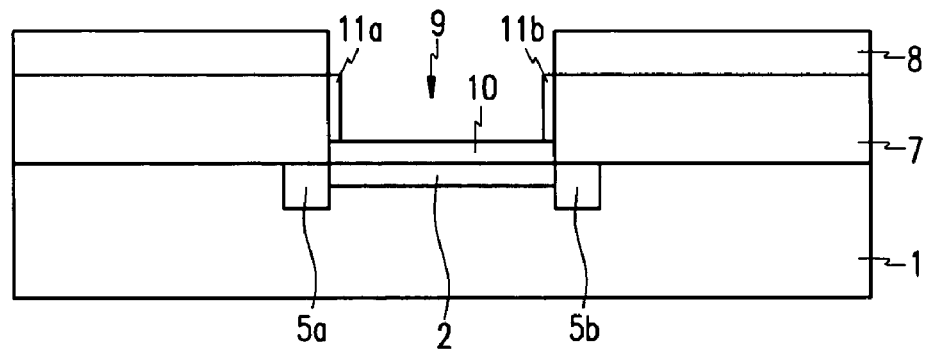

Oxygen gas (O$_2$) is sprayed on the entire surface of the upper structure of the semiconductor substrate 1 after removing the photosensitive layer. As shown in FIG. 5, gate oxide layers 11a and 11b are formed when the oxygen gas reacts with the first epitaxial layer 7 that form interior walls of the trench 9.

Figure 6:
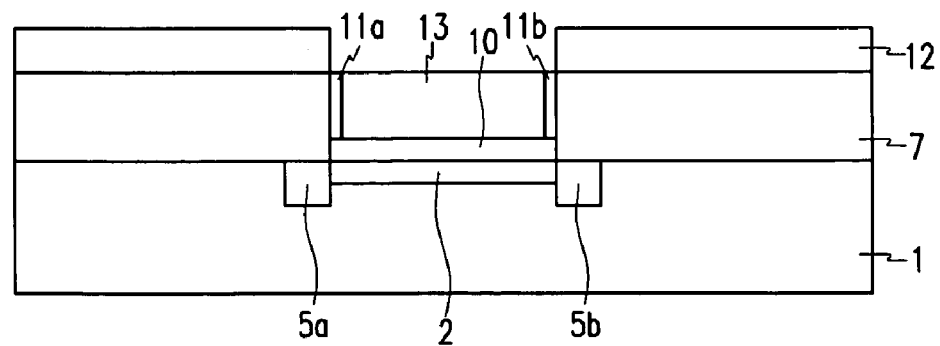

FIG. 6 shows a second epitaxial layer 12 that is formed on the first epitaxial layer 7 after removing the protection nitride layer 8. After filling the trench 9 with polysilicon, a gate electrode 13 is formed by etching the polysilicon until the gate oxide layers 11a and 11b are exposed.

Figure 7:
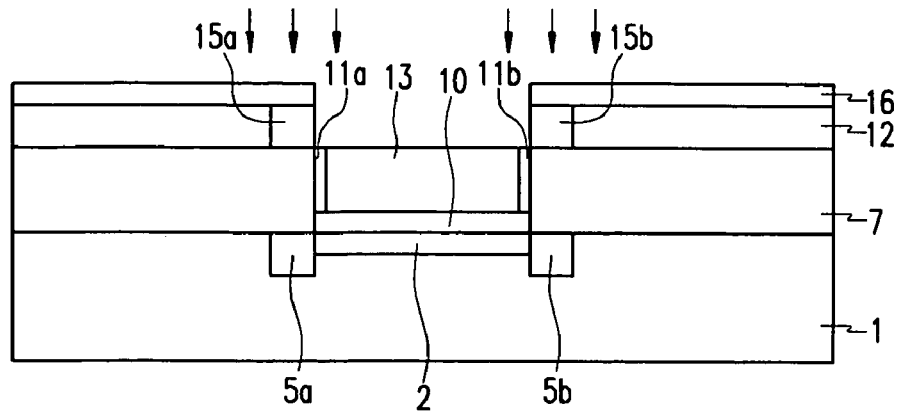

As shown in FIG. 7, a photosensitive layer 16 is formed on the second epitaxial layer 12. Source regions 15a and 15b are formed at the second epitaxial layer 12 by ion-implanting high-concentration impurities using the photosensitive layer 16 as a mask.

Figure 8:
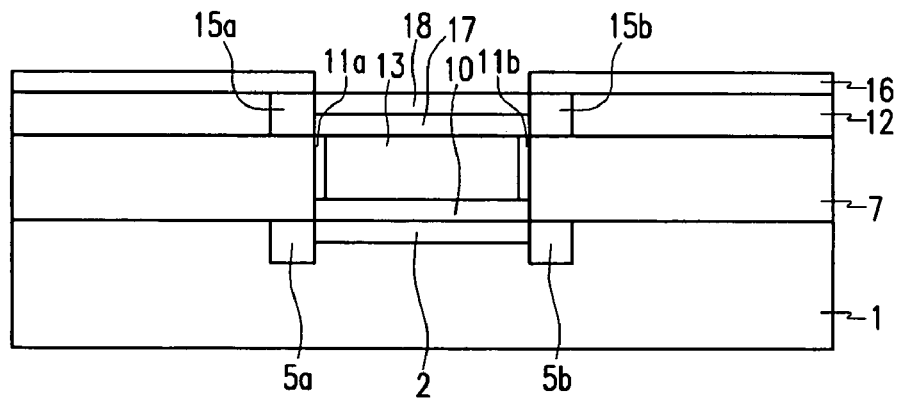

FIG. 8 shows a second gate insulation layer 17 and source silicide 18 that are sequentially formed on the gate oxide layers 11a and 11b and the gate electrode 13. Here, the second gate insulation layer 17 and source silicide 18 fill in the trench in the second epitaxial layer 12.

Figure 9:
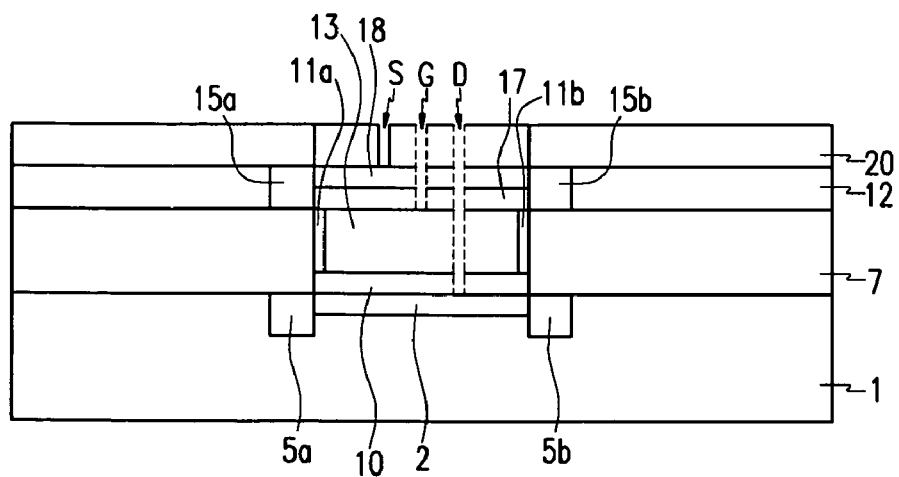

As shown in FIG. 9, an interlayer insulation layer 20 is formed on the second epitaxial layer 12, the source regions 15a and 15b, and the source silicide 18. Contact hole S, G and D are formed to permit wires or wire bonds formed on the interlayer insulation layer 20 to connect to the gate, source and drain regions. Specifically, the source contact hole S exposes a portion of the source silicide 18, the gate contact hole G exposes a portion of the gate electrode 13, and the drain contact hole D exposes a portion of the drain silicide 2. Preferably one or both of the source silicide 18 and drain silicide 2 is formed of cobalt, tantalum, or nickel.

According to the present invention, because the gate and source/drain regions are formed vertically, the transistor occupies less surface area, as the size of the foot print of the transistor is decreased, and integration efficiency of components within the semiconductor device is increased.

Further, because a space between the gate and the source/drain regions can be decreased due to the vertical structure of the transistor, power consumption by the semiconductor device can be decreased.

The above discussion is directed to a preferred embodiment of the invention. It is to be understood, however, that the invention is not limited to the disclosed embodiment. Rather, the invention is intended to cover various modifications and equivalent arrangements included within the spirit and scope of the appended claims.

The present application claims priority to, and incorporates by reference herein in its entirety, Korean patent application no. 10-2004-0111564, filed on Dec. 23, 2004.

What is claimed is:

1. A method of manufacturing a semiconductor device, comprising:
    forming a drain silicide on a semiconductor substrate;
    forming a drain region at both sides of the drain silicide;
    forming a gate nitride layer on the drain silicide;
    forming a first epitaxial layer on lateral sides of the gate nitride layer;
    forming a protection nitride layer on the first epitaxial layer and the gate nitride layer;
    etching the protection nitride layer and the gate nitride layer to form a trench;
    forming a first gate insulation layer on the drain silicide;
    forming a gate oxide layer on a portion of the first epitaxial layer exposed by the trench;
    forming a second epitaxial layer on the first epitaxial layer after removal of the protection nitride layer;
    filling the trench with polysilicon to form a gate electrode;
    ion-implanting impurities on the second epitaxial layer to form a source region;
    forming a second gate insulation layer on the gate electrode and the gate oxide layer;
    forming a source suicide on the second gate insulation layer;
    forming an interlayer insulation layer on the second epitaxial layer, the source region and the source silicide;
    forming a source contact hole to expose a portion of the source silicide;
    forming a gate contact hole to expose a portion of the gate electrode; and
    forming a drain contact hole to expose a portion of the drain silicide.

2. The method according to claim 1, wherein forming the gate oxide layer comprises reacting the first epitaxial layer with oxygen gas.

3. The method according to claim 1, wherein at least one of the source suicide and the drain suicide comprises cobalt, tantalum or nickel.

4. The method according to claim 1, wherein ion-implanting impurities on the second epitaxial layer to form the source region comprises ion-implanting high-concentration impurities.

5. The method according to claim 1, wherein forming the drain region comprises ion-implanting high-concentration impurities.

6. The method according to claim 5, wherein ion-implanting impurities on the second epitaxial layer to form the source region comprises ion-implanting high-concentration impurities.

7. The method according to claim 1, wherein the gate electrode, the source region and the drain region are formed in a vertical structure.

8. The method of claim 1, wherein the second gate insulation layer and the source silicide fill in the second epitaxial layer.

* * * * *